United States Patent [19]

Whitaker

[11] 4,067,431
[45] Jan. 10, 1978

[54] COMBINATIONAL KEYBOARD WITH MOVABLE KEYS AND ADAPTED FOR ONE-HANDED KEYING OF NUMERICAL INFORMATION

[76] Inventor: Ranald O. Whitaker, 4719 Squire Drive, Indianapolis, Ind. 46241

[21] Appl. No.: 666,480

[22] Filed: Mar. 12, 1976

[51] Int. Cl.² .............................................. B41J 5/08
[52] U.S. Cl. .................................. 197/98; 340/365 L
[58] Field of Search .................. 197/98; 335/206, 207, 335/205; 200/5 A, 159 B; 317/101, 112; 340/365; 235/145, 146; 35/5, 35 H

[56] References Cited

U.S. PATENT DOCUMENTS

| | | | |
|---|---|---|---|
| 3,311,210 | 3/1967 | Peroni | 197/98 |
| 3,351,817 | 11/1967 | Wadolny et al. | 317/112 |
| 3,828,910 | 8/1974 | Glay | 197/98 |

FOREIGN PATENT DOCUMENTS

| | | | |
|---|---|---|---|
| 1,279,693 | 9/1963 | Germany | 197/98 |

OTHER PUBLICATIONS

"Compact Keyboard" Beausoleil et al., IBM Tech. Disc. Bull., vol. 13, No. 11 4-1971, p. 3574.

*Primary Examiner*—Ralph T. Rader

[57] ABSTRACT

Combinational keyboards generally have 10 keys positioned to fall naturally under the fingertips of the two hands when the hands are in operating position. The present invention provides a keyboard with movable keys in order to accommodate the hand configurations of various operators. Combinational keyboards are generally arranged so that mathematics may be performed by the right hand only. An expanded one-handed character set results if the two thumb keys are placed adjacent each other so that the right thumb can operate both. This desirable feature is attained by (1) making the left thumb key sufficiently movable that it may be positioned adjacent the right thumb key, or (2) positioning the left hand keys so that the thumb keys are adjacent, or (3) providing an additional key operable by the right thumb.

5 Claims, 10 Drawing Figures

FIG. 3  PRIOR ART

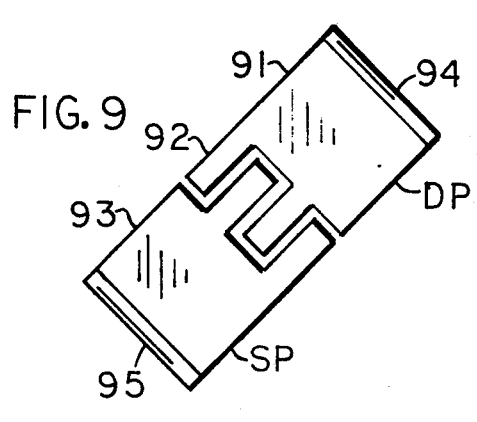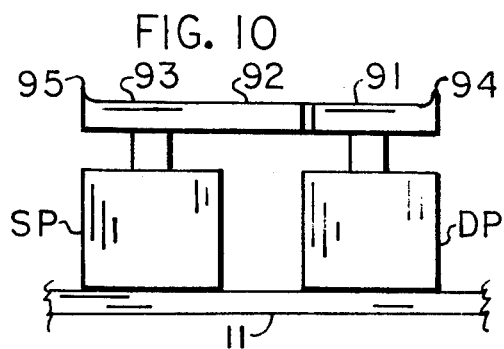

COMBINATIONAL KEYBOARD WITH MOVABLE KEYS AND ADAPTED FOR ONE-HANDED KEYING OF NUMERICAL INFORMATION

BACKGROUND

The mechanical nature of the first typewriter was such that only one key could be operated at any one time. Also, each key generated only one character. The shift mechanism was later introduced to permit each key to generate two characters. For reliable operation of the keyboard using the touch method, a total of 36 keys could be operated. However, some reduction in reliability was accepted in exchange for an expanded set of 44 keys. This permitted a maximum character set of 88 characters. Many keyboards today incorporate 48 keys, giving a character set of 96 characters. Reliable and fast operation of mechanical typewriters appears to be limited to a set of less than 100 characters.

Electronic keyboards in present usage suffer no such mechanical limitations as above outlined. Common today is the use of multiple shift keys. Two shift keys permit the standard 88 character set to be expanded to 132. Three shift keys permit the generation of 174 characters. The salient fact to be noted is that keys may now be operated in combinations much as a piano is played. The one-peck-at-a-time (OPAT) keyboard has given way to the combinational keyboard.

One such combination keyboard appears in FIG. 1. Base 11 carries keys 1, 2, 4, 8, DP (decimal point), SP (space), Z (zero), a, A, and the Greek letter alpha. The first five keys are positioned to fall naturally under the tips of the fingers of the right hand of the average operator. The second five keys are positioned to fall naturally under the fingers of the left hand.

While combinational keyboards may be used to generate the characters of the Arabic numeral set and the Phoenician alphabet set, certain advantages are realized through retirement of these time honored sets and using the keyboard to generate "Computer Compatible Characters" (CCC'S) of the type discussed in copending Application Ser. No. 593,434 and entitled COMMUNICATION SYSTEM USING BINARY COMPATIBLE CHARACTERS. The complete character used in conjunction with the present keyboard appears in FIG. 2. The character is composed of nine line elements and a dot. The DP and SP elements comprise two lines each. Each element corresponds to a respective key of the keyboard. Each character comprises a subset of the elements of the complete character. A total of 1023 such characters are possible. This last fact demonstrates the tremendous advantage of the combinational keyboard over the OPAT unit. With the former, 100 characters per key are generated. With the latter, only 2 characters per key are generated.

FIG. 3 is a code sheet relating CCC's to conventional characters. The following are noted:

1. Characters which may be generated by the fingers of the right hand only, appear along the top.
2. Characters which may be generated by the left hand only, appear along the left edge.
3. The numerals 1 to 15 may be generated by the fingers of the right hand (without the thumb). The 0 is special and will be dealt with in detail later.
4. The most used mathematical operators are generated by operating the thumb key for the right hand in combination with the numeral keys. This permits mathematics to be handled largely by the right hand only—freeing the left hand for other usage.
5. Including the "a" key into the combinations forms the lower case alphabet.
6. Including the "A" key into the combinations forms the upper case alphabet.
7. Including the "alpha" key into the combinations forms the Greek alphabet.
8. Including both the "a" and "A" keys into the combinations forms a set of punctuation marks.
9. The numerals plus the DP element may be considered a base-32 numbering system. The other elements may be added in succession to form base-64, base-128, base-256, base-512, and base-1024 systems.
10. The third line of the table presents three operational commands—

SP—Space command. A printer would normally respond to this command by leaving a blank space. However, electronically the command is represented by a code element rather than a blank. For the remaining two characters in this row, the SP element is printed.

T—Tabulation. A printer would move to the next printed column upon receipt of this character.

LF—Line Feed. A printer would advance one line and move to the left margin upon receipt of this character.

11. Of the total of 1023 characters provided, only a few of the possible assignments have been made. An italicized alphabet might be added. Or better, a host of phonemes might be represented.

The 0 (zero) has been entered three places in the table. Properly a 0 is represented by a complete absence of character elements as indicated by the 0 in Col. 1, of the table. However, such an absence cannot be distinguished from a blank space. Consequently in printed matter the 0 is represented by the high dot of FIG. 2 (Col 1, Line 4 of the table). The third 0 of FIG. 3 will be discussed later.

THE DRAWINGS

FIG. 3 is a prior art table relating Computer Compatible Characters to Arabic numerals, letters of the Phoenician alphabet, and other symbols in common usage today.

FIG. 9 is a top view of a pair of keys adapted for operation either selectively or jointly by the thumb of the right hand.

FIG. 10 is a side view of a pair of keys adapted for operation either selectively or jointly by a thumb.

DETAILED DESCRIPTION OF PREFERRED EMBODIMENT

Figure 4:
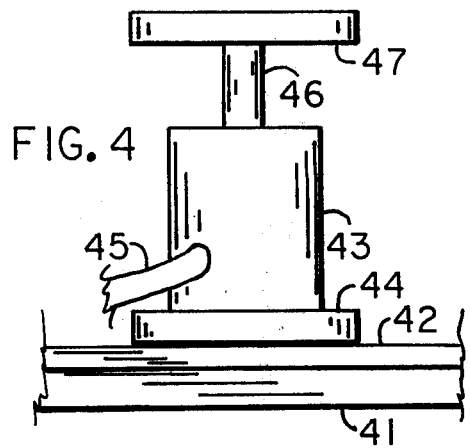
FIG. 4 is a view of a key and keyboard showing a magnetic arrangement for holding the key in position.

It was found that the position of the fingertips when the hand is in operating position varied widely from operator to operator. Consequently it was impossible to place the keys in position satisfactory to all operators. To overcome this, a keyboard having movable keys is provided in the present invention. Each operator positions the keys to accommodate his finger configuration. This is generally accomplished by placing the right hand in keying position and then using the left hand to position the respective keys under the fingertips of the right hand. The keys for the left hand are then positioned in similar manner. As shown in FIG. 4, base 41 is covered with a magnetic sheet 42. Any soft magnetic iron may be used. To the base of each key 43 is affixed a permanent magnet 44. A sintered iron magnet was found satisfactory. However, Alnico magnets cling more firmly. For maximum holding force, poles should be positioned to provide a flux loop passing from magnet to plate and back to the magnet. If the keyboard is to be operated by one person only, double sided Scotch tape can be used to affix the keys in position in a more nearly permanent manner. In an alternate system, pegs in the bottom of each key press into an appropriate set of a matrix of holes in the base. Electrical leads 45 are brought from the key and fed to appropriate terminals. The key is operated by depressing key top 47 which drives plunger 46 downward.

In several cases only the thumb keys needed to be moved. In others only the thumb and little finger keys. While in some cases operators desired that the general orientation of the keys be changed. In general, a minimum of two keys may be fixed in position. In a preferred system these are the thumb keys. Arranging procedure is:

1. Place the left hand in keying position with the thumb on the thumb key.
2. With the right hand move the remaining four left-hand keys to positions under their respective fingertips.
3. Place the right hand in keying position with the thumb on the thumb key.
4. With the left hand move the remaining four right-hand keys to positions under their respective fingertips.

Practice with the combinational keyboard revealed that the previously discussed movement of the right forefinger to cover the 0 (zero) key during one-handed operation is not satisfactory. This movement generally entails movement of the wrist and forearm, causing the operator to lose orientation. To overcome this problem, an additional code for 0 is provided. The DP and 2 elements comprise this third 0. This is objectionable in that either software or hardware must be provided to convert this code to the proper code of the Zero dot. However, it eliminates the need for shifting the forefinger.

Figure 5:
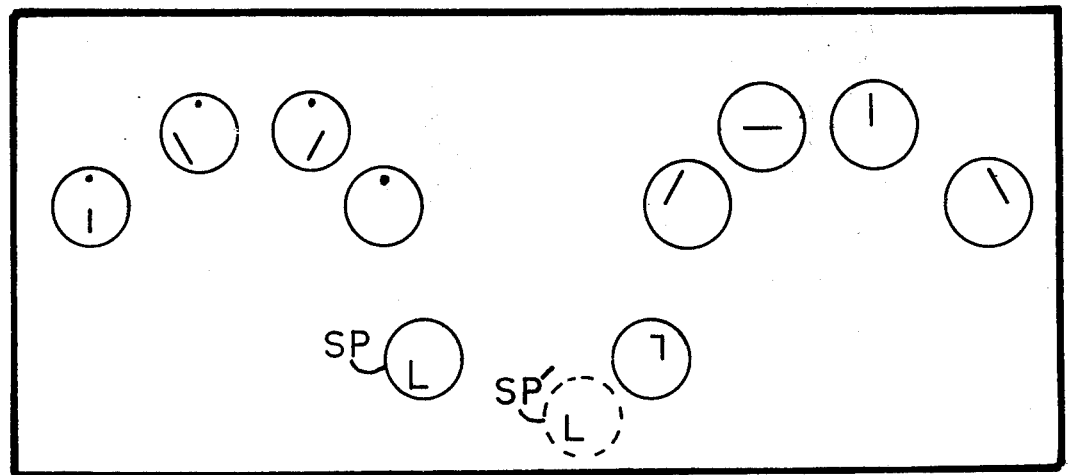
FIG. 5 is a diagram of a combinational keyboard having a left thumb key sufficiently movable that it may be placed adjacent the right thumb key to render it easily operable by the right thumb.

It was found that shifting the right thumb over to strike the Space key was objectionable unless the Space key was immediately to the left and downward (or right and upward) of the DP key. By making the SP key sufficiently movable that it could be placed in one of the two positions cited, this objection is overcome. This is shown in FIG. 5 where the SP key for two-handed operation occupies the SP position and for one-handed operation is moved to the SP' position.

Figure 6:
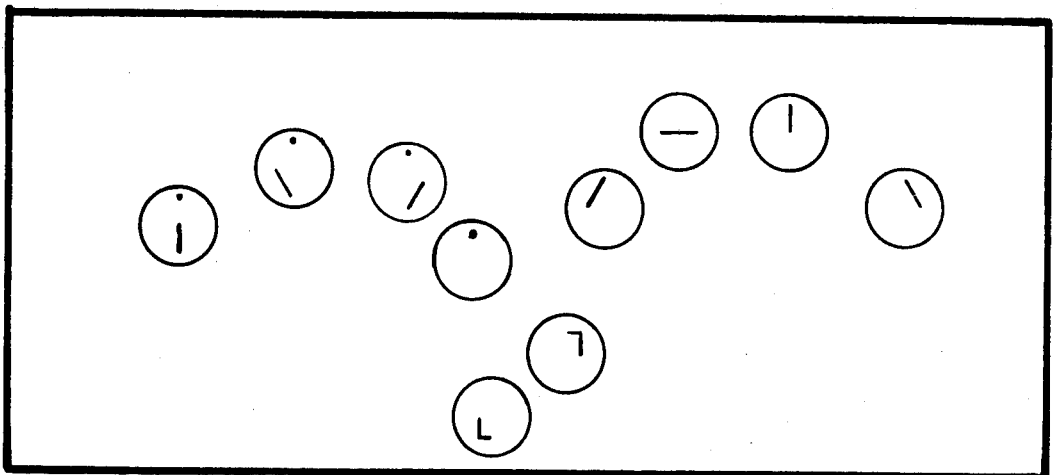
FIG. 6 is a diagram of a combinational keyboard having keys for the left hand positioned so that the left thumb key falls adjacent the right thumb key in such position that it may be easily operated by the right thumb.

A second solution to this problem involved moving all the lefthand keys so that the SP key falls immediately to the left and downward of the DP key as indicated in FIG. 6. It is found that the slight displacement is not objectionable.

Figure 1:
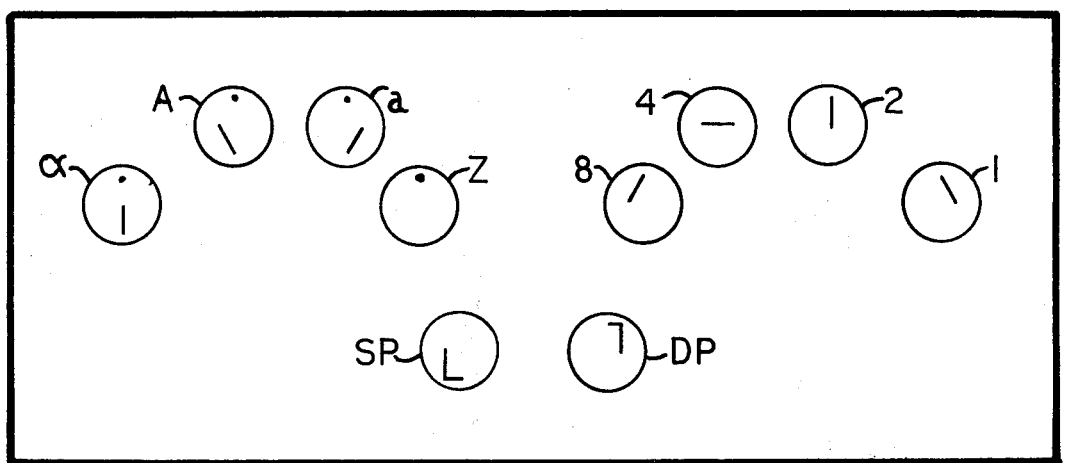
FIG. 1 is a prior art diagram of a conventional combinational keyboard.
Figure 2:
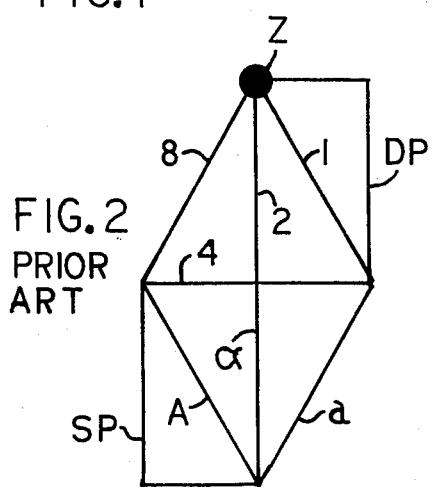
FIG. 2 is a prior art diagram of a conventional "Computer Compatible Character" adapted for being printed from a computer or other binary data system.

In the system of FIG. 1, the SP key when operated by the right thumb caused the right hand and forearm to move sufficiently that operation of the SP key in combination with the numerical keys was virtually impossible. Moving the SP key to a position adjacent the DP key permits the SP key to be operated in such combinations. Consequently the one-handed set of characters is expanded from 31 to 47.

Figure 7:
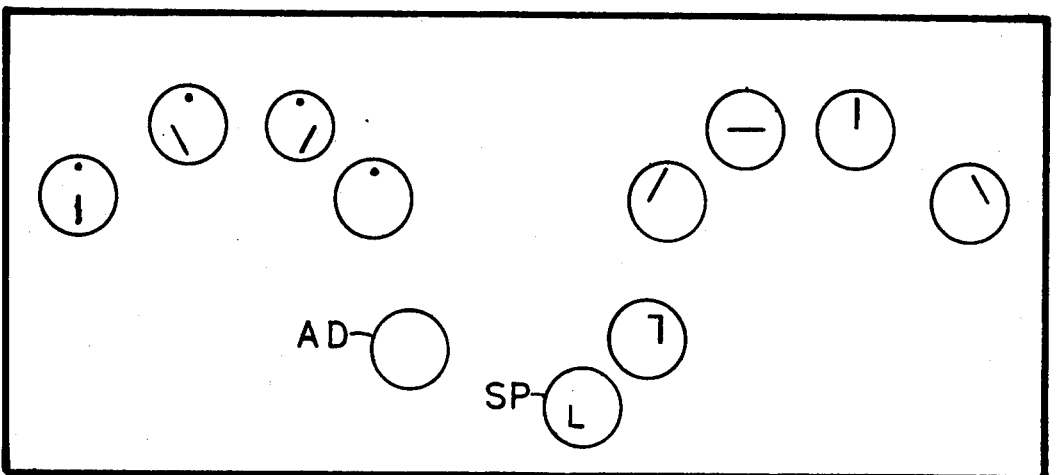
FIG. 7 is a diagram of a combinational keyboard in which an additional key has been placed adjacent the right thumb key and in such position that it can be easily operated by the right thumb.

It was found that operators preferred that the two hands be separated. A ten cm distance between the thumbs appeared optimum. One keyboard arrangement which is found satisfactory is shown in FIG. 7. The SP key is moved to a permanent position beside the DP key. An "Additional" key AD is provided in the old position of the SP key. This permits the character set to be expanded to 1535.

When the hands are in operational position, the thumbs can move sideways with ease. The little fingers move sideways less easily. The remaining fingers are not adapted for sideways motion. It follows that the thumbs may operate two keys easily. The little fingers can operate two keys, if necessary. The other fingers are essentially single key fingers—unless one wishes to resort to the crooked finger system of the conventional typewriter.

Figure 8:
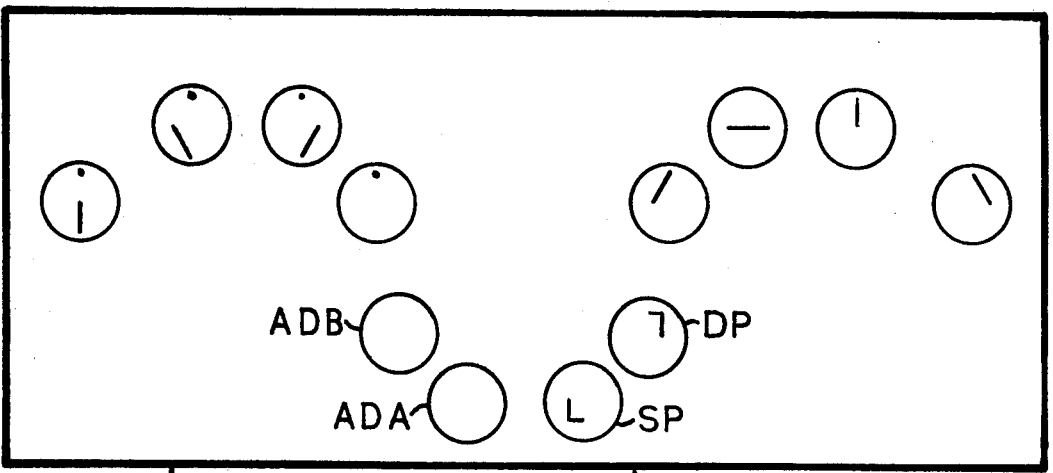
FIG. 8 is a diagram of a combinational keyboard having two additional keys, one adjacent the left thumb key and in position such that it can be easily operated by the left thumb, and a second adjacent the right thumb key and in position such that it can be easily operated by the right thumb.

In view of present technology it is difficult to envision a need for more than 1023 characters. However, technology does advance. A character set of 2303 characters is provided by the configuration of FIG. 8. The SP key is placed permanently beside the DP key. Two additional keys, ADA and ADB, are placed adjacent each other in the position formerly occupied by the SP key. They are adapted for operation by the left thumb.

The system above described is a right handed system. All numerals are keyed by the right hand. In single handed operation the right hand is used. The left is free for shuffling papers. It is apparent that a lefthanded system would serve as well and perhaps be preferable in many instances. All numerals keyed by the left hand only. In one-handed operation only the left hand used. The right hand free for shuffling papers. Consequently all discussion and all figures above used for the right-handed system apply equally well to a left-handed system. Key assignments are interchanged right to left.

In any of the above configurations when two keys are operated by one thumb and the keytops are very close together, it is possible to operate both keys simultaneously by placing the thumb at their juncture. The placement of the thumb becomes less critical if the keytops along their juncture edges are slotted and interleaved. Such a configuration is illustrated in FIG. 9, which is a top view of two such keys. The SP key and the DP key are placed adjacent each other in position for operation by the right thumb. Placement of the thumb over region 91 will result in operation of the DP key only. Placement of the thumb over region 92 will result in operation of both keys. Placement of the thumb over region 93 will result in operation of the SP key only. Raised edges 94 and 95 indicate to the operator that the thumb is in "single key" position. Other tactile feedback means may be employed. This mode of operation of the thumb keys expands the one-handed character set to 63 characters. The set for the 11 key keyboard expands to 2047 characters. The set for the 12 key keyboard expands to 4095 characters.

Particular significance attends the fact that the one-handed character set is expanded to 63 characters. This is sufficient to cover upper and lower case alphabets, Space, Line Feed, Rub-Out, and eight punctuation marks. It follows that character assignments could be made which would pemit non-mathematical text to be keyed one handedly.

Figure 3:
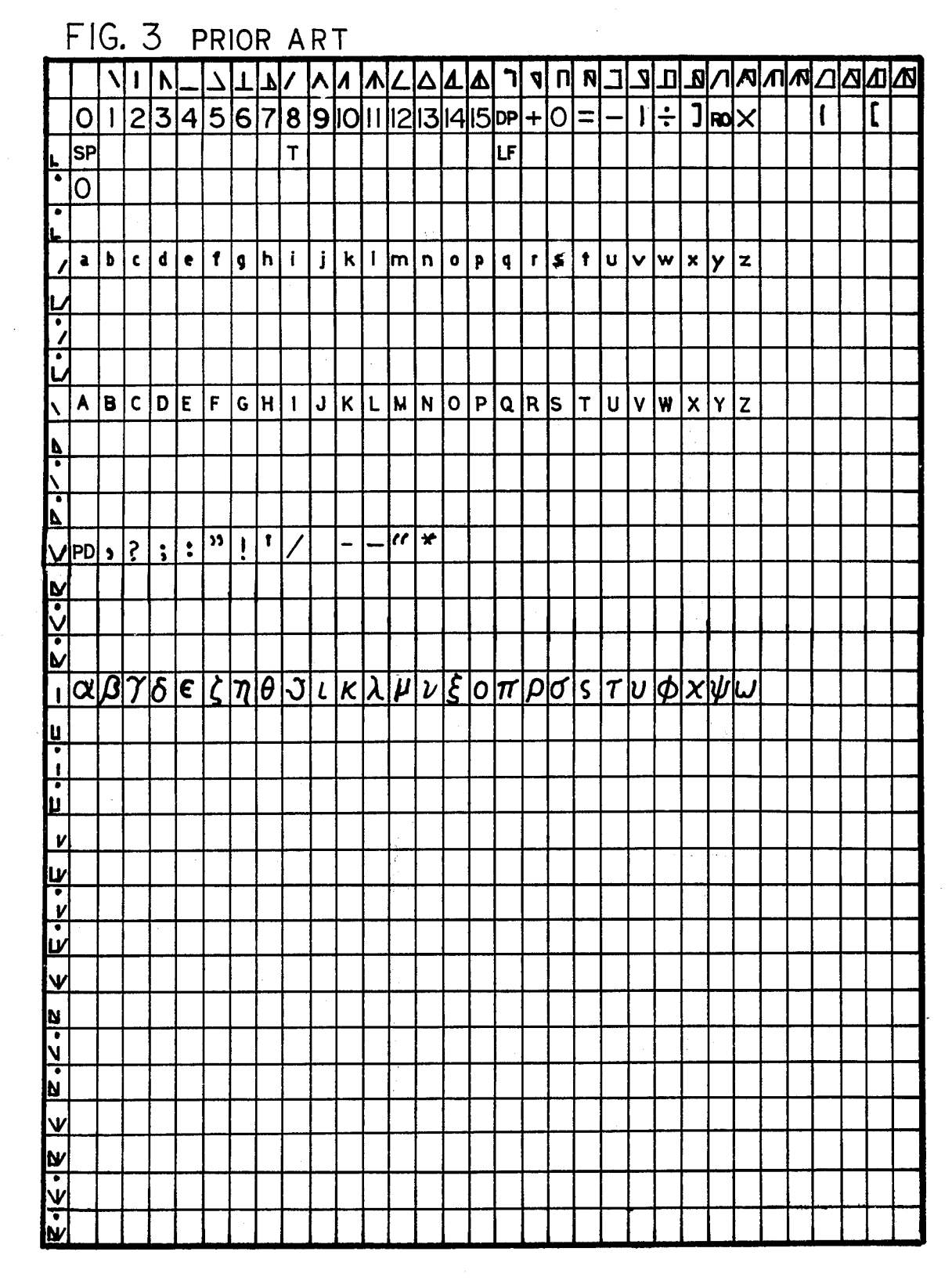

It is noted that the combinational keyboard is generally used with computers or other digital data devices. The device is capable of changing code before outputting to a printer. It follows that character assignments may be changed easily. A change in a computer instruction or a change in the programming of an ROM is all that is necessary. This is in marked contrast to the changing of type in a typewriter. Consequently the assignment of FIG. 3 is suggestive but not definitive. Each individual operator may modify the assignment or make for himself an all new assignment. The assignment of FIG. 3 is good for an operator who will be keying computer programs with their extensive use of numerical information. The assignment with upper and lower case alphabets plus punctuation marks on one hand would be most advantageous in tabulating information from a source consisting of a large number of short handwritten notes—one hand would be free for sifting through the notes. If the notes contained numerical information, the lower case alphabet could be replaced by a set of digits and mathematical operators.

Assignment for the entire keyboard may be changed by the throw of a switch on the computer or the depression of a "Shift" key on the keyboard. The latter would be very similar to the shift key on a present typewriter—which changes the assignment for the period that the key is depressed. However, the assignment change for the combinational keyboard would normally remain until a new command is given. Numerous assignments may be retained in memory and any particular one called by an individual operator. Where assignments are not too complex, an individual operator may learn two or more assignments—as is presently done for the numerical keys of a typewriter. Illustrative of a simple change consider the case of keying material consisting of all capital letters. In this case the ring finger of the left hand would for the assignment of FIG. 3 be depressed for every character. The assignment could be changed to eliminate this need. The material could then be keyed using the right hand only. A slightly less simple change in assignment could be made to eliminate need for depression of the middle finger of the left hand for all lower case letters—if the text does not contain numerics and mathematical operators.

I claim:

1. A combinational data keyboard adapted for operation by the fingers of a human operator and comprising: a magnetic base, a set of keys, means for permitting said operator to place each key at a selectable position on said base, said means comprising a set of magnets, each of said magnets being affixed to the base of a respective key, wherein the keys are moved on the base to positions corresponding to the natural hand configuration of the operator.

2. A combinational data keyboard adapted for operation by the fingers of a human operator; said data keyboard having a pair of keys juxtaposed each other, said pair of keys having keytops serrated along their juxtaposed edges with portions of one keytop being interleaved with portions of the other keytop along said edges; a first key of said pair having a keytop with serrated and non-serrated portions and being operated by a thumb of said operator when said thumb is depressed while over said portion of said first key keytop which is non-serrated;

a second key of said pair having a keytop with serrated and non-serrated portions and being operated by said thumb of said operator when said thumb is depressed while over said portion of said second key keytop which is non-serrated;

and both keys of said pair being operated by said thumb of said operator when said thumb is depressed while over the serrated and interleaved portions of said keytops.

3. A combinational data keyboard as in claim 1:

said data keyboard having a first key normally adapted for being operated by the thumb of a first hand; and said data keyboard having a second key normally adapted for being operated by the thumb of the second hand;

said means being adapted for permitting said first key to be placed by said operator adjacent said second key in such position that said first key can be conveniently operated by said thumb of said second hand after said thumb of said second hand is moved by said operator in a lateral direction.

4. A data keyboard as in claim 2;

said keytops having tactile means adapted for indicating to said operator the position of said thumb on said keytops.

5. A data keyboard as in claim 4;

said tactile means being a raised portion at the outer edge of each key.

* * * * *